United States Patent [19]
Takiguchi et al.

[11] Patent Number: 5,007,107
[45] Date of Patent: Apr. 9, 1991

[54] SEMICONDUCTOR LASER DEVICE

[75] Inventors: Haruhisa Takiguchi, Nara; Hiroaki Kudo, Tenri; Chitose Sakane; Satoshi Sugahara, both of Nara, all of Japan

[73] Assignee: Sharp Kabushiki Kaisha, Osaka, Japan

[21] Appl. No.: 432,063

[22] Filed: Nov. 6, 1989

[30] Foreign Application Priority Data

Nov. 8, 1988 [JP] Japan ................. 63-282999

[51] Int. Cl.$^5$ ............................................. H01S 3/19
[52] U.S. Cl. ..................................... 372/96; 372/45
[58] Field of Search ................. 372/96, 45; 11/43, 44

[56] References Cited

U.S. PATENT DOCUMENTS

| | | | |
|---|---|---|---|
| 4,178,604 | 12/1979 | Nakamura et al. | 357/16 |
| 4,745,615 | 5/1988 | Kaneiwa et al. | 372/96 |
| 4,852,116 | 7/1989 | Takiguchi et al. | 372/96 |

FOREIGN PATENT DOCUMENTS

| | | |
|---|---|---|
| 0182508 | 5/1986 | European Pat. Off. . |
| 0253597 | 1/1988 | European Pat. Off. . |

OTHER PUBLICATIONS

K. Kobayashi et al., Electronic Letters, vol. 21, No. 20, pp. 931–932, Sep. 26, 1985.
H. Takiguchi et al., IEDM 87, pp. 788–791, May 1987.
Patent Abstracts of Japan, 12:, 407, (E-675) (3254) (10-2-7-88).
Patent Abstracts of Japan, 12:, 26, (E-577) (2873) (1-2-6-88).

Primary Examiner—Georgia Epps
Attorney, Agent, or Firm—Irell & Manella

[57] ABSTRACT

A semiconductor laser device is disclosed which comprises an active layer positioned between a first cladding layer and a second cladding layer, the active layer being made of a compound semiconductor material selected from the group consisting of $(Al_xGa_{1-x})_{0.5}In_{0.5}P$ ($0 \leq x \leq 0.7$), $Al_xGa_{1-x}As$ ($0 \leq x \leq 0.4$), and $Ga_xIn_{1-x}P_{1-y}As_y$ ($0.5 \leq x \leq 1$, $0 \leq y \leq 1$, and $y = 2x - 1$), wherein an optical guiding layer having a diffraction grating made of $(Al_xGa_{1-x})_{0.5}In_{0.5}P$ ($0 \leq x \leq 1$) is positioned between the active layer and one of the cladding layers.

5 Claims, 1 Drawing Sheet

SEMICONDUCTOR LASER DEVICE

BACKGROUND OF THE INVENTION

1. Field of the Invention

This invention relates to a semiconductor laser device having a diffraction grating, which attains laser oscillation in a single longitudinal mode at a wavelength of 580 to 890 nm, such as a distributed feedback semiconductor laser device and distributed Bragg reflection semiconductor laser device.

2. Description of the prior art

In cases where semiconductor laser devices are used as a light source in an optical information transmission system, optical measurement system, or any other system utilizing optical fibers, these semiconductor laser devices are preferred to have the operating characteristics of oscillating in a single longitudinal mode. Examples of the well-known semiconductor laser devices which attain laser oscillation in a single longitudinal mode are distributed feedback semiconductor laser devices and distributed Bragg reflection semiconductor laser devices, in which a diffraction grating with a periodically corrugated pattern is formed over the active region or in the vicinity of the active region, respectively.

FIG. 2 shows a conventional distributed feedback semiconductor laser device, wherein on the plane of an n-InP substrate 11, an n-InP first cladding layer (i.e., buffer layer) 12, an undoped InGaPAs active layer 13, a p-InGaPAs optical guiding layer 14, a p-InP second cladding layer 15, and a p-InGaPAs cap layer 16 are successively grown. On the upper face of the cap layer 16 and the back face of the substrate 11, p-sided and n-sided ohmic electrodes 17 and 18 are formed, respectively. The optical guiding layer 14 has, on its surface, a diffraction grating for laser oscillation. Such an InGaPAs/InP laser device which can attain laser oscillation at a longer wavelength of 1,300 nm among semiconductor laser devices has been used in optical fiber communication.

In contrast, distributed feedback semiconductor laser devices and distributed Bragg reflection semiconductor laser devices with a similar structure, which have an oscillation wavelength of 890 nm or less, can also be considered. These semiconductor laser devices may have a structure in which on the plane of an n-GaAs substrate, an n-$Al_xGa_{1-x}As$ first cladding layer, an undoped $Al_xGa_{1-x}As$ active layer, a p-$Al_xGa_{1-x}As$ optical guiding layer, a p-$Al_xGa_{1-x}As$ second cladding layer, and a p-GaAs cap layer are successively grown. In such a structure, the p-$Al_xGa_{1-x}As$ second cladding layer is to be grown on the diffraction grating which has been formed on the surface of the p-$Al_xGa_{1-x}As$ optical guiding layer. Therefore, it has been believed that the growth of semiconductor crystals on the $Al_xGa_{1-x}As$ layer is difficult, because semiconductor crystals containing aluminum (Al), such as $Al_xGa_{1-x}As$, are susceptible to oxidation in air to form an oxide film on its surface. However, the inventors have found that the excellent crystal growth on the $Al_xGa_{1-x}As$ layer (the Al mole fraction x meeting the relation $0 \leq x \leq 0.4$) having a diffraction grating can be achieved by liquid phase epitaxy without any oxygen leakage. With the use of this technique, the inventors have realized a distributed feedback $Al_xGa_{1-x}As$ laser device with an oscillation wavelength of 780 nm.

However, even when a diffraction grating made of $Al_xGa_{1-x}As$ ($x=0.3$) is used, which has the greatest band gap in the $Al_xGa_{1-x}As$ crystals capable of yielding excellent crystal growth, the laser oscillation cannot be obtained at a wavelength of less than 740 nm, because the band gap of the active layer becomes smaller than that of the optical guiding layer having the diffraction grating. Therefore, the technique for producing a semiconductor laser device having a diffraction grating, which attains laser oscillation at a wavelength of 740 nm or less, has not yet been established. On the other hand, in the case of distributed feedback semiconductor laser devices with an oscillation wavelength of 740 nm or more wherein an $Al_xGa_{1-x}As$ optical guiding layer having a diffraction grating is disposed in the vicinity of the active layer, these semiconductor laser devices have poor temperature characteristics, because the optical guiding layer has a small Al mole fraction x and therefore has a small band gap, so that satisfactory carrier confining effects cannot be obtained.

SUMMARY OF THE INVENTION

The semiconductor laser device of this invention, which overcomes the above-discussed and numerous other disadvantages and deficiencies of the prior art, comprises an active layer positioned between a first cladding layer and a second cladding layer, the active layer being made of a compound semiconductor material selected from the group consisting of $(Al_xGa_{1-x})_{0.5}In_{0.5}P$ ($0 \leq x \leq 0.7$), $Al_xGa_{1-x}As$ ($0 \leq x \leq 0.4$), and $Ga_xIn_{1-x}P_{1-y}As_y$ ($0.5 \leq x \leq 1$, $0 \leq y \leq 1$, and $y = 2x - 1$), wherein an optical guiding layer having a diffraction grating made of $(Al_xGa_{1-x})_{0.5}In_{0.5}P$ ($0 \leq x \leq 1$) is positioned between the active layer and one of the cladding layers.

In a preferred embodiment, the abovementioned semiconductor laser device can attain laser oscillation at a wavelength of 580 to 890 nm.

In a preferred embodiment, the optical guiding layer is disposed over the active layer.

In a preferred embodiment, the optical guiding layer is disposed on the portion of the active layer other than the active region thereof.

In a preferred embodiment, the optical guiding layer has a band gap and refractive index both intermediate between those of the active layer and the cladding layers.

Thus, the invention described herein makes possible the objective of providing a semiconductor laser device with excellent temperature characteristics, which can attain laser oscillation in a single longitudinal mode at a wavelength of 580 to 890 nm, such as a distributed feedback semiconductor laser device and distributed Bragg reflection semiconductor laser device.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
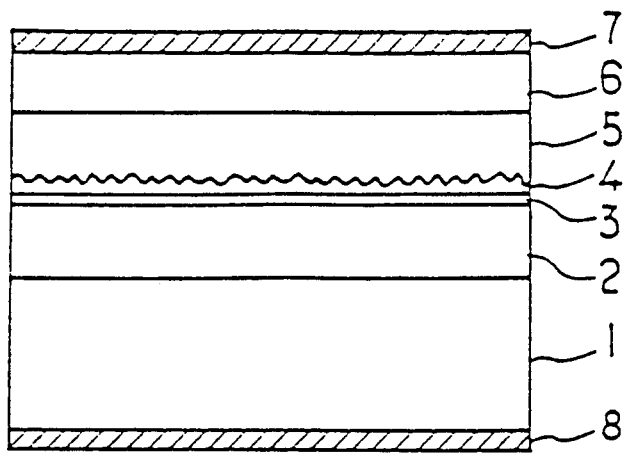
FIG. 1 is a front sectional view of a distributed feedback semiconductor laser device of this invention.
Figure 2:
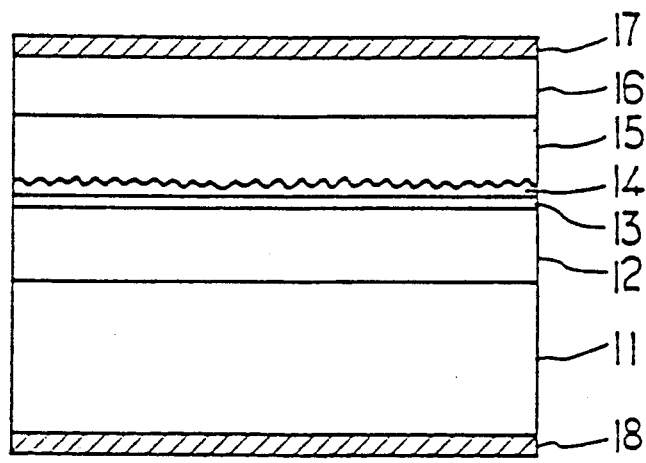
FIG. 2 is a front sectional view of a conventional distributed feedback semiconductor laser device.

FIG. 1 shows a distributed feedback semiconductor laser device of this invention, which is produced as follows: On the plane of an n-GaAs substrate 1, an n-$(Al_xGa_{1-x})_{0.5}In_{0.5}P$ cladding layer (x=0.5) 2, an undoped $(Al_xGa_{1-x})_{0.5}In_{0.5}P$ active layer (x=0) 3, and a p-$(Al_xGa_{1-x})_{0.5}In_{0.5}P$ optical guiding layer (x=0.25) 4 are successively grown. The optical guiding layer 4 is made of quaternary mixed crystals having a band gap and refractive index both intermediate between those of the active layer 3 and the cladding layer 2.

Then, on the top surface of the optical guiding layer 4, a photoresist layer is formed into a corrugated pattern with a periodicity of 1,900 Å by the interference exposure method using an ultraviolet laser. The surface of the optical guiding layer 4 is etched by a chemical etching technique where the photoresist layer with the above-mentioned periodic corrugation is used as a mask, resulting in a periodically corrugated pattern (i.e., diffraction grating) on the surface of the optical guiding layer 4. The pitch of the diffraction grating is 1,900 Å. After removal of the photoresist layer, on the surface of the optical guiding layer 4 having a diffraction grating, a p-$(Al_xGa_{1-x})_{0.5}In_{0.5}P$ cladding layer (x=0.5) 5 and a p-GaAs cap layer 6 are successively grown, followed by forming ohmic metal electrodes 7 and 8 on the upper face of the cap layer 6 and the back face of the substrate 1, respectively.

In the above-mentioned example, each of the semiconductor layers constituting a multi-layered crystal structure for laser operation of the double heterostructure laser device is composed of $(Al_xGa_{1-x})_{0.5}In_{0.5}P$ ($0 \leq x \leq 1$), and in particular, the active layer 3 is composed of $(Al_xGa_{1-x})_{0.5}In_{0.5}P$ (x=0), so that the oscillation wavelength becomes about 670 nm. The optical guiding layer 4 is formed so as to have a band gap and refractive index both intermediate between those of the active layer 3 and the cladding layers 2 and 5.

As a method for the growth of $(Al_xGa_{1-x})_{0.5}In_{0.5}P$ layers, there can be mentioned molecular beam epitaxy and metal-organic vapor phase epitaxy. The inventors have found that the successive $(Al_xGa_{1-x})_{0.5}In_{0.5}P$ layer can be grown on the $(Al_xGa_{1-x})_{0.5}In_{0.5}P$ light guiding layer having a diffraction grating at any Al mole fraction x by molecular beam epitaxy or metal-organic vapor phase epitaxy, provided the surface of the light guiding layer is subjected to vapor phase etching just before the growth. Therefore, it is possible to produce distributed feedback semiconductor laser devices in which the active layer is composed of $(Al_xGa_{1-x})_{0.5}In_{0.5}P$ with any Al mole fraction x.

The oscillation wavelength can be allowed to decrease with a increase in the Al mole fraction x of $(Al_xGa_{1-x})_{0.5}In_{0.5}P$ constituting the active layer 3. The semiconductor laser device of this invention, which comprises an $(Al_xGa_{1-x})_{0.5}In_{0.5}P$ active layer ($0 \leq x \leq 0.7$), can attain laser oscillation at a wavelength of 580 to 670 nm. Also in this case, the Al mole fraction x is set to increase and the refractive index is set to decrease in order of the active layer, the optical guiding layer, and the cladding layers, thereby allowing laser light to be sufficiently waveguided within the optical guiding layer.

Even in the distributed feedback semiconductor laser device of this invention, which comprises an $Al_xGa_{1-x}As$ active layer ($0 \leq x \leq 0.4$) and attains laser oscillation at a wavelength of 650 to 870 nm, the use of an $(Al_xGa_{1-x})_{0.5}In_{0.5}P$ optical guiding layer ($0 \leq x \leq 1$) having a diffraction grating can improve its temperature characteristics because of a greater band gap of the optical guiding layer compared with the $Al_xGa_{1-x}As$ (x=0.4) active layer. Moreover, the present invention is also applicable to distributed Bragg reflection semiconductor laser devices as a matter of course.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a semiconductor laser device comprising an active layer positioned between a first cladding layer and a second cladding layer, said active layer being made of, a compound semiconductor material selected from the group consisting of $(Al_xGa_{1-x})_{0.5}In_{0.5}P$ ($0 \leq x \leq 0.7$), $Al_xGa_{1-x}As$ ($0 \leq x \leq 0.4$), and $Ga_xIn_{1-x}P_{1-y}As_y$ ($0.5 \leq x \leq 1$, $0 \leq y \leq 1$, and $y=2x-1$), wherein an optical guiding layer having a diffraction grating made of $(Al_xGa_{1-x})_{0.5}In_{0.5}P$ ($0 \leq x \leq 1$) is positioned between said active layer and one of said cladding layers.

2. A semiconductor laser device according to claim 1, which can attain laser oscillation at a wavelength of 580 to 890 nm.

3. A semiconductor laser device according to claim 1, wherein said optical guiding layer is disposed over said active layer.

4. A semiconductor laser device according to claim 1, wherein said optical guiding layer is disposed on the portion of said active layer other than the active region thereof.

5. A semiconductor laser device according to claim 1, wherein said optical guiding layer, has a band gap and refractive index both intermediate between those of said active layer and said cladding layers.

* * * * *